United States Patent
Takano et al.

(10) Patent No.: US 9,641,009 B2
(45) Date of Patent: *May 2, 2017

(54) CHARGING DEVICE FOR SECONDARY BATTERY AND CHARGING METHOD FOR SECONDARY BATTERY

(71) Applicant: NISSAN MOTOR CO., LTD., Yokohama-shi, Kanagawa (JP)

(72) Inventors: Atsushi Takano, Sagamihara (JP); Tsutomu Soga, Machida (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/422,523

(22) PCT Filed: Jul. 10, 2013

(86) PCT No.: PCT/JP2013/068823
§ 371 (c)(1),
(2) Date: Feb. 19, 2015

(87) PCT Pub. No.: WO2014/030451
PCT Pub. Date: Feb. 27, 2014

(65) Prior Publication Data
US 2015/0236541 A1    Aug. 20, 2015

(30) Foreign Application Priority Data
Aug. 20, 2012   (JP) .................. 2012-181793

(51) Int. Cl.
*H02J 7/00* (2006.01)
*G01R 31/36* (2006.01)
*G01K 13/00* (2006.01)

(52) U.S. Cl.
CPC ............ *H02J 7/0052* (2013.01); *G01K 13/00* (2013.01); *G01R 31/3606* (2013.01)

(58) Field of Classification Search
USPC ......................................... 320/107
See application file for complete search history.

(56) References Cited

U.S. PATENT DOCUMENTS 5,563,493 A * 10/1996 Matsuda ................. G06F 1/263
320/124
6,097,176 A    8/2000 Yao et al.
(Continued)

FOREIGN PATENT DOCUMENTS

CN        100382408 C    4/2008
CN        101834324 A    9/2010
(Continued)

OTHER PUBLICATIONS

USPTO Office Action, U.S. Appl. No. 14/384,030, May 6, 2016, 20 pages.
(Continued)

*Primary Examiner* — Yalkew Fantu
(74) *Attorney, Agent, or Firm* — Foley & Lardner LLP (57) ABSTRACT

A charging device includes charging power detection unit and full charge determination unit. The charging device further includes charging control unit adapted to repeatedly execute a additional charging control until the number of times of the full charge determination reaches a predetermined full charge determination count. The charging device further includes unit adapted to detect the temperature of the secondary battery, and full charge determination count setting unit adapted to set a larger full charge determination count as the temperature decreases at least based on the temperature of the secondary battery when the full charge determination is made.

6 Claims, 10 Drawing Sheets

(56) References Cited

U.S. PATENT DOCUMENTS

| | | | |
|---|---|---|---|
| 6,937,947 B2* | 8/2005 | Trembley | H02J 7/0091 |
| | | | 320/107 |
| 7,906,934 B2 | 3/2011 | Inoue et al. | |
| 2005/0237024 A1 | 10/2005 | Hogari et al. | |
| 2008/0272653 A1 | 11/2008 | Inoue et al. | |
| 2010/0176768 A1 | 7/2010 | Kimura et al. | |
| 2012/0112703 A1 | 5/2012 | Xu et al. | |
| 2015/0054449 A1* | 2/2015 | Takano | H01M 10/443 |
| | | | 320/107 |

FOREIGN PATENT DOCUMENTS

| | | |
|---|---|---|
| JP | 05-083876 A | 2/1993 |
| JP | 7-312230 A | 11/1995 |
| JP | 2000-150000 A | 5/2000 |
| JP | 2002-303658 A | 10/2002 |
| JP | 10-145979 A | 5/2003 |
| JP | 2003-143770 A | 5/2003 |
| JP | 2003-324857 A | 11/2003 |
| JP | 2005-124340 A | 5/2005 |
| JP | 2005-312239 A | 11/2005 |
| JP | 2006-288002 A | 10/2006 |
| JP | 2007-143214 A | 6/2007 |

OTHER PUBLICATIONS

Uspto Notice of Allowance, U.S. Appl. No. 14/384,030, Sep. 12, 2016, 9 pages.

* cited by examiner

| MINIMUM BATTERY TEMPERATURE | COUNT |
|---|---|
| -25 | 3 |
| -10 | 2 |
| -1 | 2 |
| 0 | 2 |
| 1 | 1 |
| 10 | 1 |
| 20 | 1 |
| 45 | 1 |

| FULL CHARGE DETERMINATION COUNT | 1 | 2 | 3 | 4 | 5 |
|---|---|---|---|---|---|
| CORRECTION COEFFICIENT $\alpha$ | 1 | 0.8 | 0.6 | 0.4 | 0.4 |

CHARGING DEVICE FOR SECONDARY BATTERY AND CHARGING METHOD FOR SECONDARY BATTERY

TECHNICAL FIELD

This invention relates to a charging control for secondary battery.

BACKGROUND ART

A known charging device for secondary battery performs so-called additional charging by detecting a fully charged state of a secondary battery based on the temperature and voltage of the secondary battery, stopping charging when the fully charged state is detected and resuming charging after the elapse of a predetermined time after the stop. JP2003-143770A discloses a charging device for performing such additional charging, which device detects a peak voltage at the time of a full charge detection and increases a repeat count of additional charging as the peak voltage decreases.

SUMMARY OF INVENTION

However, if the repeat count of additional charging is set as in the above literature, there is a problem that an actually charged state of the secondary battery cannot be brought closer to the fully charged state in some cases.

Accordingly, the present invention aims to set an appropriate repeat count of additional charging at which a secondary battery can be brought to a state closer to a fully charged state and the execution of useless additional charging can be avoided.

DESCRIPTION OF EMBODIMENTS

Hereinafter, embodiments of this invention are described with reference to the accompanying drawings.

First Embodiment

Figure 1:
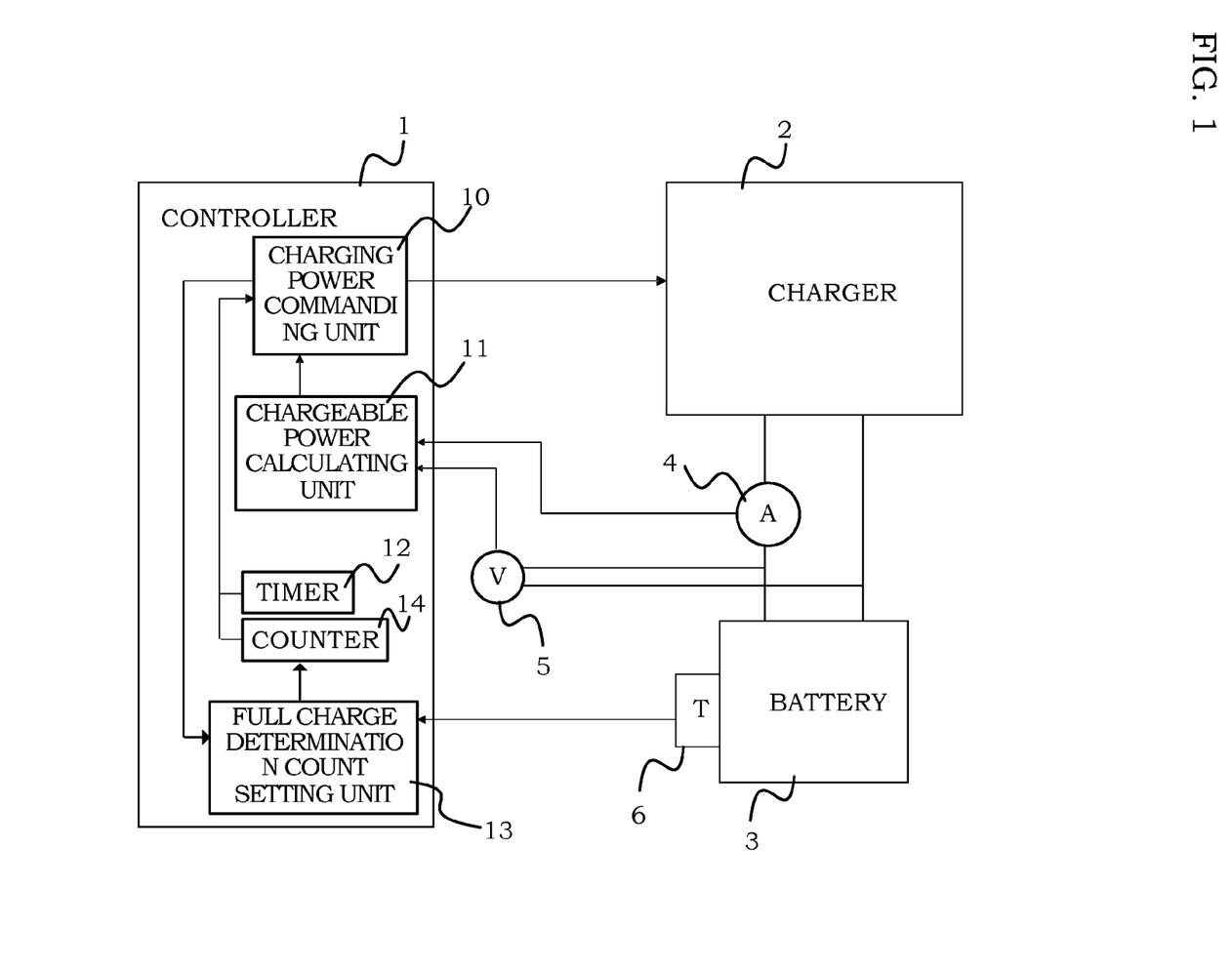
FIG. 1 is a configuration diagram of a charging system of a first embodiment.

FIG. 1 is a configuration diagram of a charging system of an embodiment of the present invention.

The charging system includes a battery 3, a charger 2 as a charging power supply for supply charging power to the battery 3 and a controller 1 for controlling the charger 2. The charging system further includes a current sensor 4 as charging power detection means for detecting a charging current supplied from the charger 2 to the battery 3, a voltage sensor 5 as charging power detection means for detecting a battery voltage and a temperature sensor 6 as temperature detection means for detecting the temperature of the battery 3.

The controller 1 calculates power to be charged to the battery 3 from the charger 2 based on detection values of the current sensor 4 and the voltage sensor 5, and the controller 1 sends a charging power command based on the calculated charging power to the charger 2. Further, the controller 1 also reads a detection value of the temperature sensor 6. The internal configuration of the controller 1 is described later.

The charger 2 supplies charging power based on the charging power command from the controller 1 to the battery 3.

The battery 3 is a secondary battery such as a lithium-ion battery used, for example, as a power source for driving a drive motor of an electric vehicle, and charged by the charging power supplied from the charger 2.

The detection values of the current sensor 4, the voltage sensor 5 and the temperature sensor 6 are read into the controller 1.

Next, the internal configuration of the controller 1 is described. It should be noted that an operation content in each constituent unit is described with reference to a flow chart of FIG. 2.

The controller 1 includes a chargeable power calculating unit 11, a charging power commanding unit 10 as full charge determination means and charging control means, a timer 12, a counter 14 and a full charge determination count setting unit 13 as full charge determination count setting means.

The chargeable power calculating unit 11 reads the detection values of the current sensor 4 and the voltage sensor 5 and calculates chargeable power based on these. The chargeable power is a maximum value of power chargeable to the battery 3 without promoting the degradation of the battery 3, and power receivable by the battery 3. This chargeable power is generally also referred to as inputtable power, maximum chargeable power or maximum inputtable power in addition to the chargeable power.

The charging power commanding unit 10 sends a charging power command based on the chargeable power calculated in the chargeable power calculating unit 11 to the charger 2. Further, the charging power commanding unit 10 determines a fully charged state and stops charging, i.e. sets the charging power command at zero (kW) when the chargeable power calculated in the chargeable power calculating unit 11 becomes equal to or less than predetermined power set in advance. Further, when the charging power commanding unit 10 determines a fully charged state, the charging power commanding unit 10 sends a command for causing the full charge determination count setting unit 13 to set a full charge determination count (hereinafter, referred to as a full charge determination count setting command) as a predetermined count. The charging power commanding unit 10 reads a count value of the timer 12 to be described later after sending a stop time setting command. When the count value becomes zero, the charging power commanding unit 10 will resume the sending of the charging power command based on the chargeable power to the charger 2, thereby performing so-called additional charging. The timer 12 has a stop time after the full charge determination set in advance and starts counting down (process of reducing the count value at every predetermined time). A minimum value of the count value is zero.

The full charge determination count setting unit 13 calculates a full charge determination count corresponding to a battery temperature and sets the calculated full charge determination count in the counter 14 upon receiving the full charge determination count setting command from the charging power commanding unit 10. It should be noted that, although described in detail later, the full charge determination count corresponding to the battery temperature increases as the battery temperature decreases.

The counter 14 increments a counter value every time the full charge determination is made due to additional charging. This counter value is a value which is initially zero and incremented every time the full charge determination is made due to additional charging, and an integrated value of the number of times of the full charge determination from the start of additional charging. The charging power commanding unit 10 finishes the charging control when the counter value of the counter 14 reaches the set full charge determination count.

Figure 2:
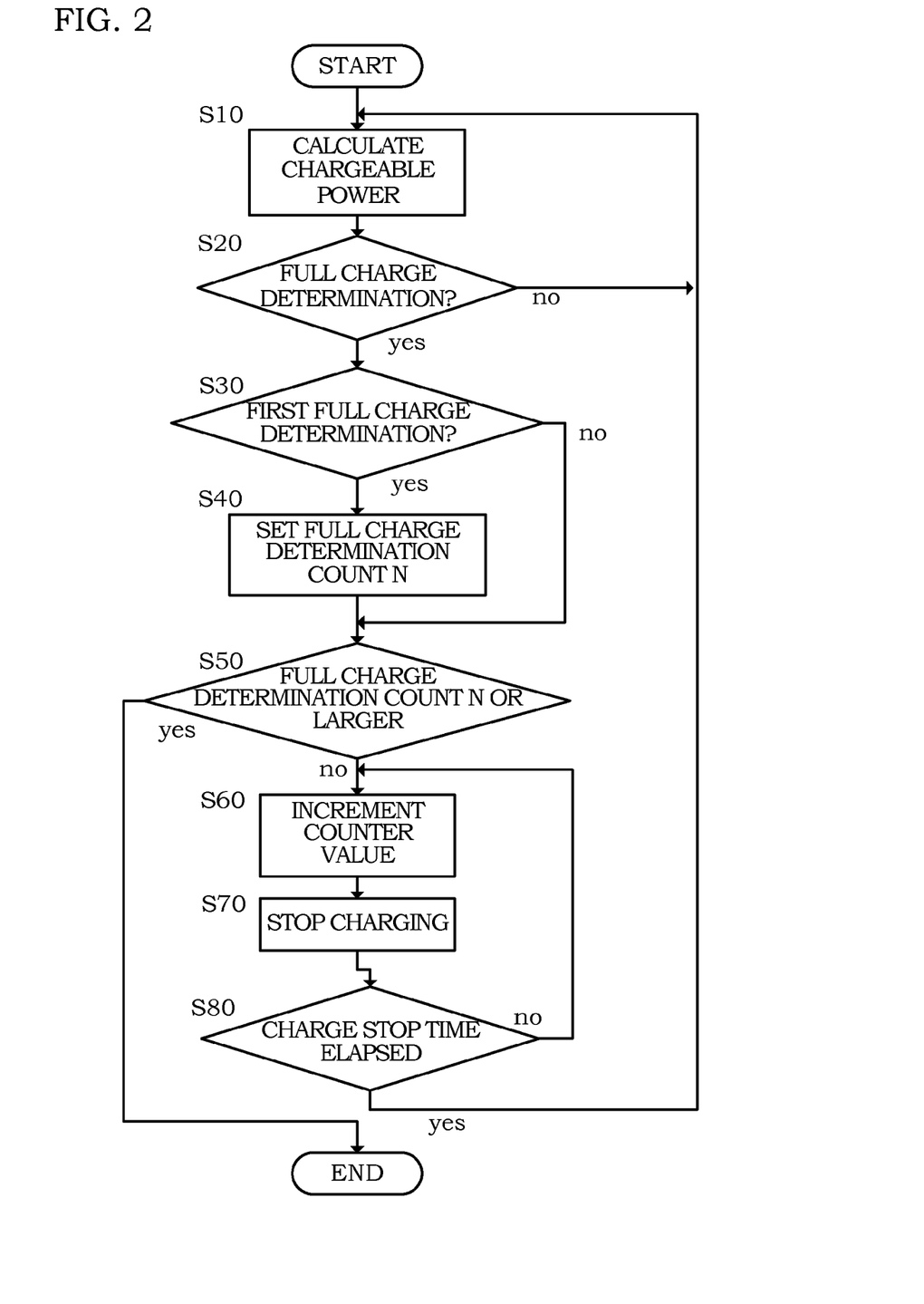
FIG. 2 is a flow chart of a charging control routine according to the first embodiment.

FIG. 2 is a flow chart of a charging control routine executed by the controller 1.

In a Step S10, the controller 1 calculates the chargeable power. More specifically, the chargeable power is calculated based on the detection value of the current sensor 4 and that of the voltage sensor 5 in the chargeable power calculating unit 11 and sent to the charging power commanding unit 10, and the charging power commanding unit 10 sends the charging power command to the charger 2.

Here, an example of a chargeable power calculation method is descried. First, a deviation between a full charging voltage set in advance and the detection value of the voltage sensor 5, i.e. a voltage increase margin $\Delta V$ up to the full charging voltage is calculated. Subsequently, a current increase margin $\Delta I$ until the voltage of the battery 3 reaches the full charging voltage is calculated using the voltage increase margin $\Delta V$ and a resistance R of the battery 3 measured in advance. A power increase margin until the full charging voltage is reached, i.e. the chargeable power can be calculated from the voltage increase margin $\Delta V$ and the current increase margin $\Delta I$.

In a Step S20, the controller 1 determines in the charging power commanding unit 10 whether or not the fully charged state has been reached. Specifically, the fully charged state is deter mined if the chargeable power becomes equal to or less than predetermined power determined in advance (hereinafter, this determination is referred to as the "full charge determination"). The predetermined power may be set at zero [kW] from the purpose of determination in this step, but there is a possibility that the chargeable power does not decrease to zero and the fully charged state is not determined due to detection errors of the sensors 4, 5 and the like. Accordingly, such a value substantially close to zero [kW] that the fully charged state can be determined even in the presence of errors of the sensors 4, 5 is set.

As a result of the determination, the controller 1 executes a processing of a Step S30 if the full charge determination is made, whereas the controller 1 executes a processing of the Step S10 again unless the full charge determination is made.

The full charge determination is only a determination that the chargeable power has become equal to or less than the predetermined power, but not a determination that the battery 3 has actually reached the fully charged state (ion adsorption amount of a negative electrode is maximized).

In the Step S30, the controller 1 determines whether or not the full charge determination of the Step S20 is the first full charge determination. Specifically, the controller 1 determines whether or not the counter value of the counter 14 is zero. If the counter value of the counter 14 is zero, the controller 1 determines that the full charge determination of the Step S20 is not the full charge determination in additional charging and executes a processing of a Step S50. On the other hand, if the counter value of the counter 14 is larger than zero, the controller 1 determines that the full charge determination of the Step S20 is the full charge determination in additional charging and executes a processing of a Step S40.

In the Step S40, the controller 1 sets a full charge determination count N until the end of the charging control after the first full charge determination. Specifically, the full charge determination count N set here is the number of times of performing additional charging. The number of times of performing additional charging can also be set at N by setting a full charge determination count N+1 as a full charge determination count from the start to the end of the charging control. In the following description, the full charge determination count N is set as the number of times of performing additional charging until the end of the charging control after the first full charge determination.

Figure 3:
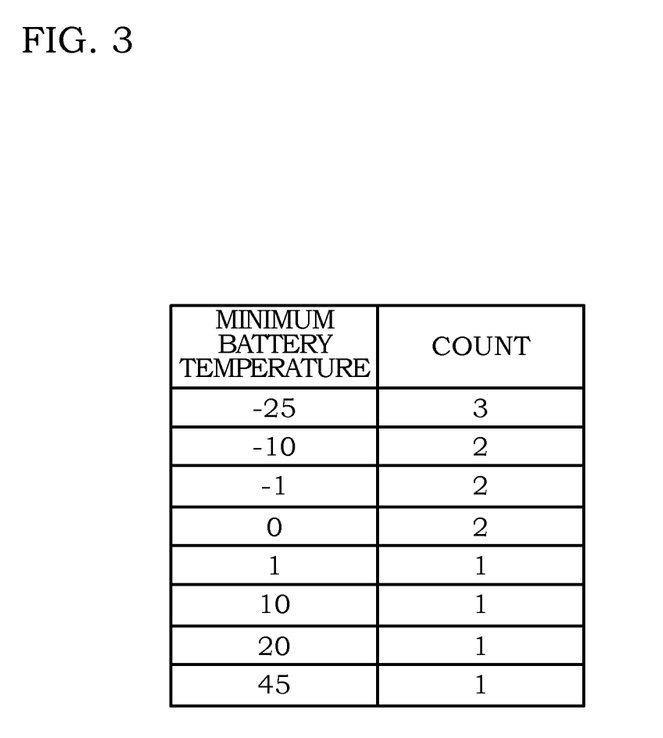
FIG. 3 is a full charge determination count table.

The full charge determination count setting unit 13 reads the detection value of the temperature sensor 6, determines the full charge determination count N by referring to a full charge determination count table stored in advance, sets the determined count (full charge determination count N) and counts the number of times of determining the full charge. The full charge determination count table is such that the count increases as the battery temperature decreases, for example, as shown in FIG. 3. This is based on a characteristic that it takes a longer time to resolve polarization as the battery temperature decreases. For example, in the case of a lithium-ion battery, polarization results from a density difference caused by the dispersion of lithium ions which are dispersion substances. The viscosity of an electrolytic solution increases and it takes a longer time to resolve polarization as the battery temperature decreases. Thus, if additional charging is performed without polarization being sufficiently resolved while charging is stopped, the fully charged state is immediately reached on the surface. Accordingly, it is possible to bring the charged state closer to a true fully charged state by setting a larger full charge determination count as the battery temperature decreases.

It should be noted that a stop time map is not limited to that of FIG. 3 if a condition of setting a larger stop count as the battery temperature decreases is satisfied. For example, a temperature region may be divided into a plurality of sections and the stop count may be set for each section.

In the Step S50, the controller 1 determines whether or not the number of times of determining the full charge (i.e. counter value of the counter 14) has become N, which is the full charge determination count set in the Step S30, or larger. If the number of times of determining the full charge is N or larger, the counter value of the counter 14 is reset to zero and a charging power command value is set at zero [kW] in the charging power commanding unit 10 and sent to the charger 2, thereby finishing the charging control.

In a Step S60, the controller 1 increments the value of the counter that counts the number of times of determining the full charge. The counter increments the counter value every time the full charge determination is made in the Step S20 until the counter value is determined to be not smaller than a specified count in Step S50.

In a Step S70, the controller 1 sets the charging power command value at zero [kW] in the charging power commanding unit 10 and sends it to the charger 2, thereby stopping charging.

In a Step S80, the controller 1 determines whether or not a charging stop time has elapsed in the charging power commanding unit 10. The charge stop time is a time set in advance and, for example, about several minutes.

As described above, a larger charge stop count (which is the full charge determination count N and also written as the charge stop count below) as the battery temperature at the time of the full charge determination decreases, and additional charging is repeatedly performed until the full charge determination count reaches the charge stop count, thereby bringing the charged state of the battery 3 closer to the true fully charged state.

Figure 4:
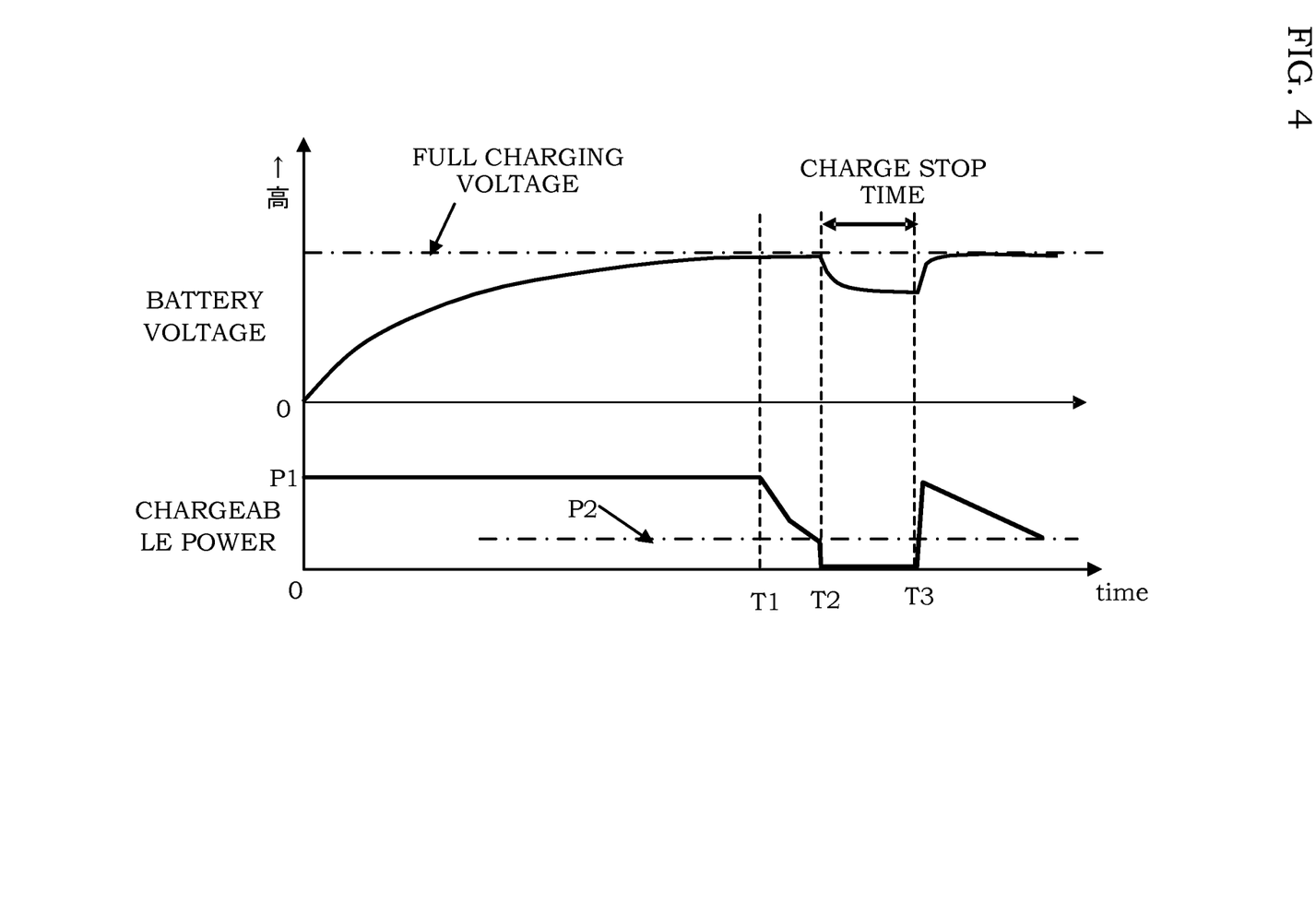
FIG. 4 is a time chart in the case of executing a charging control.

FIG. 4 is a time chart in the case of executing the above charging control.

When charging is started, the battery voltage gradually increases. It should be noted that the chargeable power is a constant value until timing T1. This is because, although larger chargeable power is calculated in operation, it is limited by P1 which is an upper limit of supply capability of the charger 2.

The chargeable power starts decreasing from timing T1, at which the battery voltage approaches the full charging voltage, when the calculated chargeable power falls below P1 as the upper limit of supply capability of the charger 2, and the full charge determination is made to temporarily stop charging at timing T2 at which the chargeable power becomes equal to or less than P2 which is a predetermined value set for the full charge determination. From timing T3 after the elapse of the charge stop time, additional charging is started. Thereafter, until the full charge determination count reaches the charge stop count N, charging is similarly repeatedly stopped and resumed.

Figure 5:
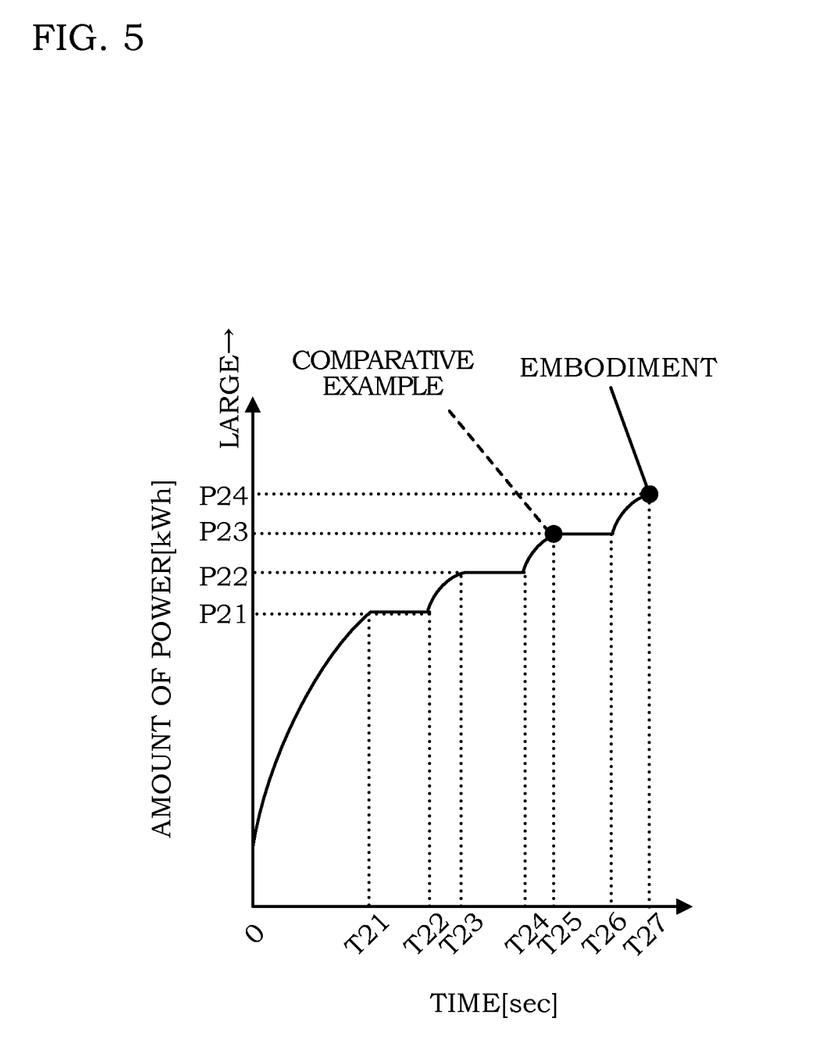
FIG. 5 is a time chart showing effects by the first embodiment.

FIG. 5 is a time chart of the amount of power charged to the battery 3. As a comparative example, a case is also shown where the full charge determination count is constant (2 times) regardless of the battery temperature. In both the present embodiment and the comparative example, the charge stop time is a predetermined time set in advance.

It should be noted that the amount of power in the true fully charged state (a state close to the true fully charged state is meant and, hereinafter, merely referred to as the true fully charged state) is P24 [kWh]. Further, the battery temperature is, for example, near −25° C. Thus, in the present embodiment, the full charge determination count is set at 3 times based on the table of FIG. 3. That is, an additional charging count in the present embodiment is 3 times, whereas that in the comparative example is 2 times.

In both the present embodiment and the comparative example, the first full charge determination is made at timing T21 at which the amount of power reaches P21 [kWh]. In the present embodiment, the full charge determination count N is set here.

In both the present embodiment and the comparative example, charging is resumed at timing T22 reached upon the elapse of the charge stop time, the full charge determination is made and a full charge determination counter is set at 1 at timing T23 at which the amount of power reaches P22 [kWh]. Then, charging is resumed at timing T24 reached upon the elapse of the charge stop time, and the full charge determination is made and the full charge determination counter is set at 2 at timing T25 at which the amount of power reaches P23 [kWh].

In the comparative example in which the additional charging count is set at 2 times, charging is finished here. Thus, charging is finished at the amount of power P23 less than the amount of power P24 [kWh] in the true fully charged state. Contrary to this, since the additional charging count is 3 times in the present embodiment, charging is resumed at timing T26 reached upon the elapse of the charge stop time and performed until timing T27 at which the third full charge determination is made. In this way, the amount of charging power reaches P24 [kWh] and the true fully charged state can be set.

It should be noted that if the additional charging count of the comparative example set in advance is 3 times, the true fully charged state can be set as in the present embodiment. However, if the battery temperature is, for example, 10 [° C.] or 20 [° C.], additional charging is uselessly performed even after the true fully charged state is already reached. Contrary to this, the additional charging count is reduced as the battery temperature increases in the present embodiment in which the additional charging count is set according to the battery temperature, such useless additional charging is not performed.

As described above, the following effects are achieved according to the present embodiment.

Due to the occurrence of polarization, a secondary battery may be set in a fully charged state on the surface even if it is in a chargeable state. Accordingly, the resolution of polarization is waited by stopping charging for a predetermined time after the fully charged state is detected, and then additional charging is performed. However, if the temperature of the secondary battery decreases, polarization is resolved at a slower rate and the amount of power chargeable by one additional charging is reduced. Thus, it may not be possible to charge sufficient power if a repeat count set according to a peak voltage is used, for example, as disclosed in the above patent literature 1. On the other hand, if the repeat count is so set that the fully charged state can be set even if the temperature of the secondary battery is low, additional charging is uselessly performed when the temperature of the secondary battery is a normal temperature.

According to the present embodiment, the full charge determination count setting unit 13 is provided which sets the full charge determination count N at least based on the battery temperature when the full charge determination is made, and sets a larger full charge determination count N as the battery temperature decreases. Since the repeat count of additional charging can be set at an appropriate count according to the battery temperature in this way, the true fully charged state can be set and the execution of useless additional charging can be avoided.

Second Embodiment

In a second embodiment, the charge stop time after the full charge determination is set according to the battery temperature at the time of the full charge determination in addition to the control of the first embodiment.

Figure 6:
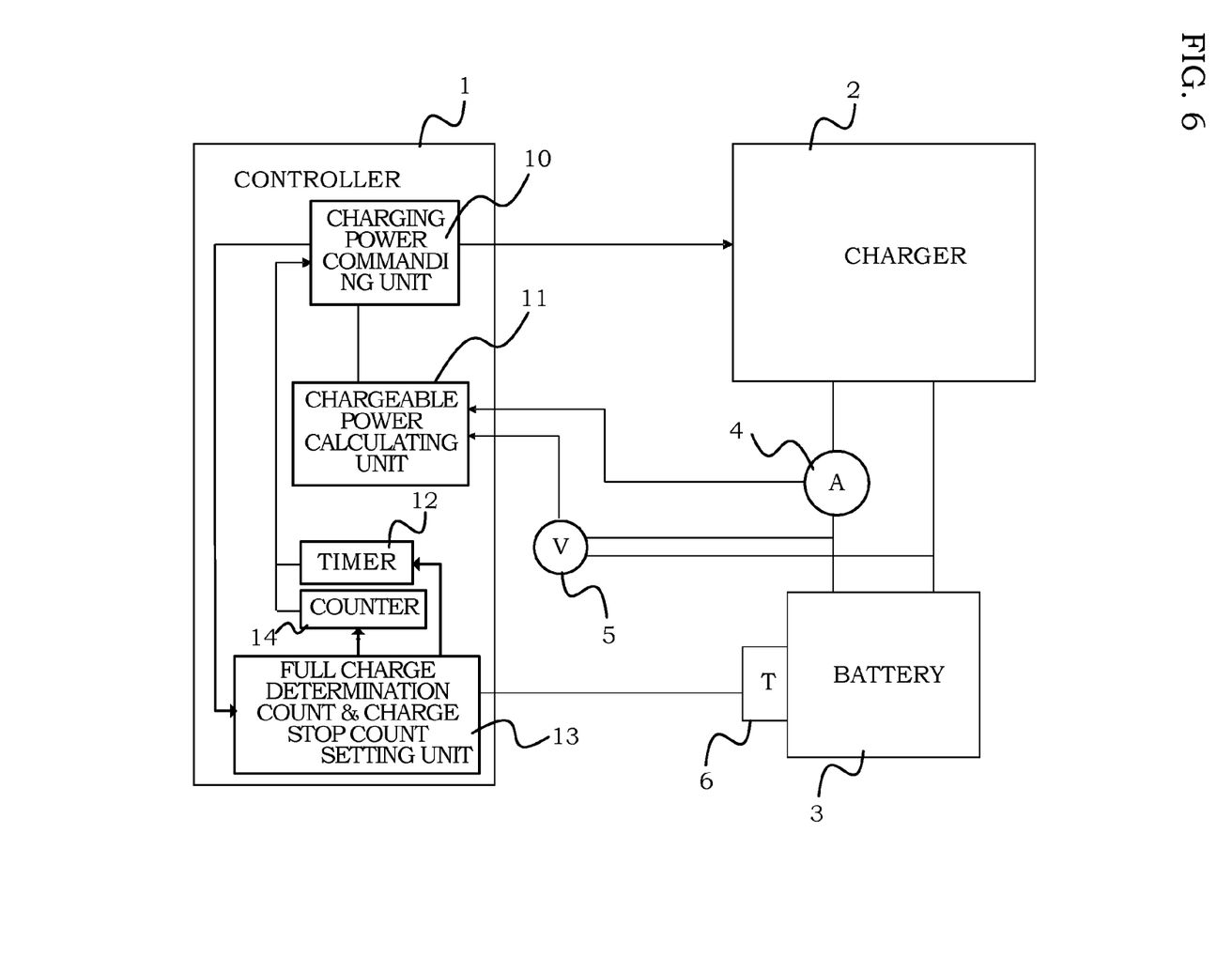
FIG. 6 is a configuration diagram of a charging system of a second embodiment.

FIG. 6 is a configuration diagram of a charging system of the second embodiment. Basically, the second embodiment is similar to the first embodiment, but differs therefrom in that a full charge determination count setting unit 13 calculates not only the full charge determination count, but also the charge stop time after the full charge determination and the set charge stop time is set in a timer 12.

Figure 7:
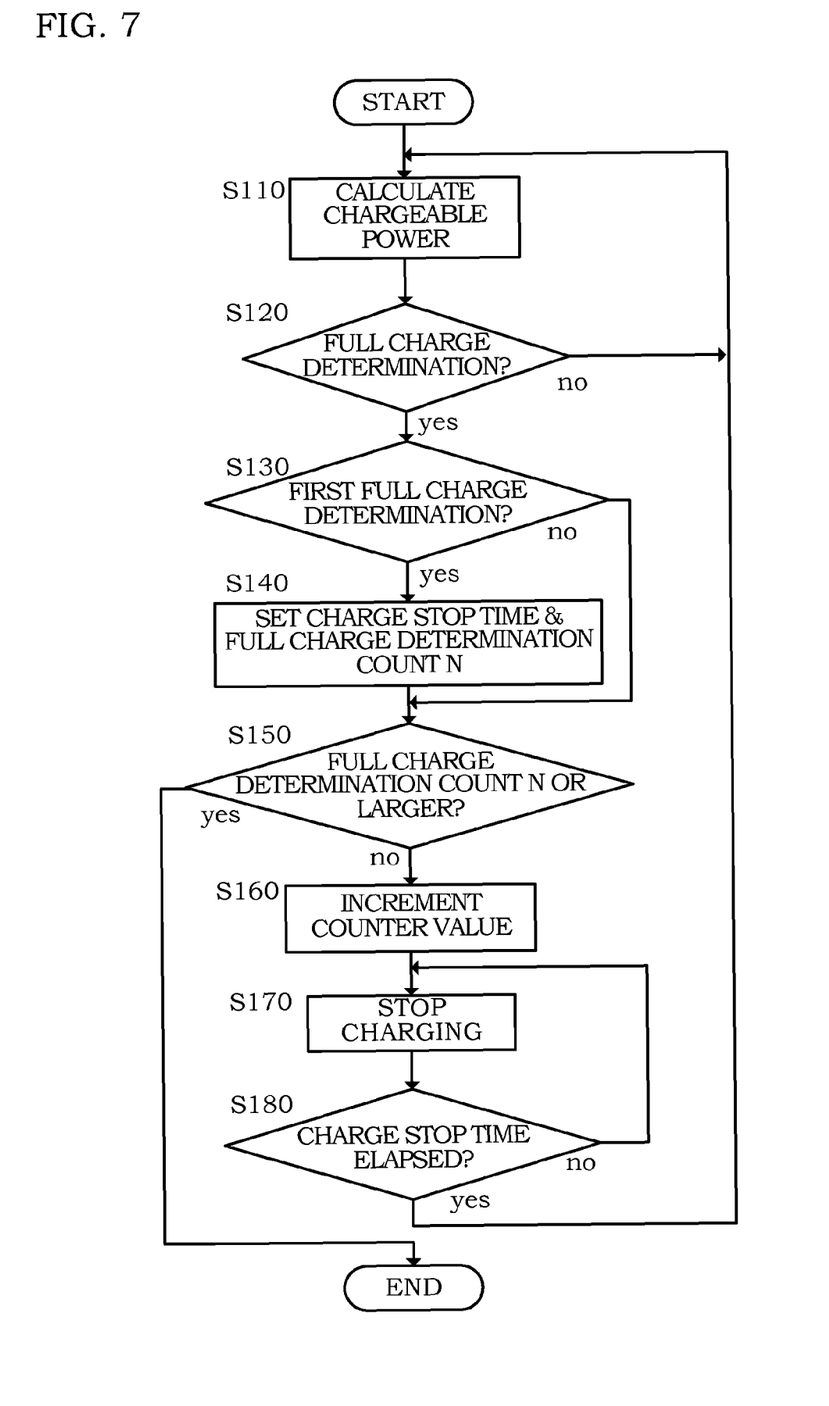
FIG. 7 is a flow chart of a charging control routine according to the second embodiment.

FIG. 7 is a flow chart of a charging control routine executed by a controller 1 in the second embodiment. The controller 1 sets the full charge determination count N according to the battery temperature in the first embodiment, but also sets the charge stop time according to the battery temperature in addition to the full charge determination count N in the second embodiment. Here, points of difference from the first embodiment are described.

Steps S110, S120 and S130 are not described since being similar to Steps S10, S20 and S30 of FIG. 2.

In a Step S140, the controller 1 sets the full charge determination count N according to the battery temperature by a procedure similar to that in the Step S40 of FIG. 2 and further sets the charge stop time according to the battery temperature.

The full charge determination count N set here is similar to that of the first embodiment in that it increases as the battery temperature decreases, but becomes smaller than in the first embodiment as the battery temperature decreases. This is described later.

Figure 8:
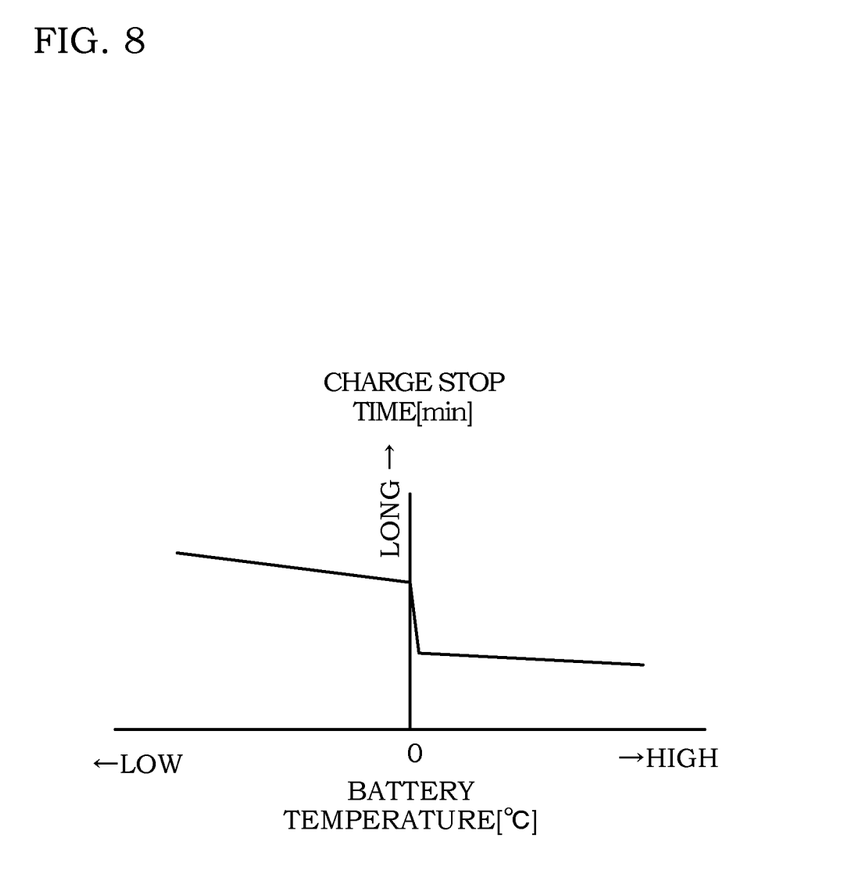
FIG. 8 is a stop time map.

The controller 1 determines the charge stop time by reading a detection value of a temperature sensor 6 and referring to a stop time map stored in advance. The controller 1 sets the determined setting time in the timer 12 and starts the countdown of the timer 12. The stop time map is configured to set a longer stop time as the battery temperature decreases, for example, as shown in FIG. 8. This is based on a characteristic that it takes a longer time to resolve polarization as the battery temperature decreases. For example, in the case of a lithium-ion battery, polarization results from a density difference caused by the dispersion of lithium ions which are dispersion substances and the viscosity of an electrolytic solution increases and it takes a longer time to resolve polarization as the battery temperature decreases. Thus, polarization is sufficiently resolved until charging is resumed by setting a longer charge stop time as the battery temperature decreases.

Further, by performing additional charging in a state where polarization is sufficiently resolved, the amount of charging power by additional charging is increased per additional charging. Thus, an additional charging count required until a true full charge is reached can be reduced. However, since a shorter time is required to resolve polarization in a state where the battery temperature is high than in a state where the battery temperature is low, an effect of resolving polarization by extending the charge stop time is small. Therefore, the additional charging count can be reduced by setting the charge stop time according to the battery temperature only in a region where the battery temperature is low.

It should be noted that the stop time map is not limited to that of FIG. 8 if a condition of setting a longer stop time as the battery temperature decreases is satisfied. For example, a temperature region may be divided into a plurality of sections and the stop time may be set for each section.

Further, once the full charge determination count and the charge stop time are set after the first full charge determination, the set values are maintained until the charging control is finished.

Steps S150 to S180 are not described since being similar to Steps S50 to S80 of FIG. 2.

As described above, additional charging is repeatedly performed by setting a larger full charge determination count and a longer charge stop time as the battery temperature at the time of the full charge determination decreases, thereby bringing the charged state of a battery 3 closer to the true fully charged state.

Figure 9:
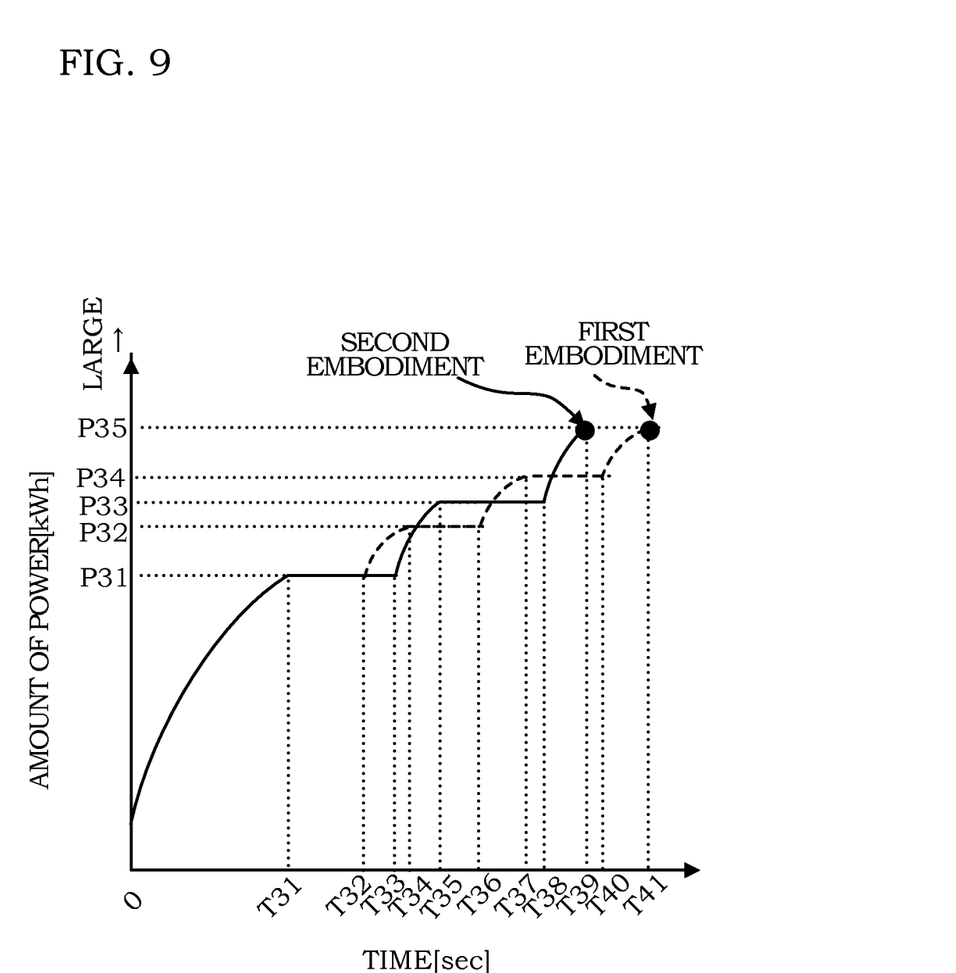
FIG. 9 is a time chart showing effects by the second embodiment.

FIG. 9 is a time chart of the amount of power charged to the battery 3. As a comparative example, a case is also shown where the control of the first embodiment is executed.

It should be noted that the amount of power in the true fully charged state is P35 [kWh]. Further, the battery temperature is near −25° C. as in FIG. 5, and it is assumed that the full charge determination count is set at 3 times in the first embodiment and at 2 times in the second embodiment based on the table of FIG. 3.

A chart of the first embodiment is similar to that of FIG. 5, the first full charge determination is made at timing T31 and the true fully charged state is reached at timing T41 by repeating additional charging three times thereafter.

Contrary to this, in the second embodiment, charging is stopped until timing T33 later than timing T32 after the first full charge determination is made at timing T31. This causes additional charging to be performed in a state where the resolution of polarization is advanced, and the amount of power reaches P33 [kWh] larger than the amount of power P32 at the end of the first additional charging in the first embodiment when the full charge determination is made by the first additional charging. Then, at timing T39 at which the second additional charging is finished, the power of amount reaches P35 [kWh], i.e. the true fully charged state is reached.

As described above, a time until the true fully charged state is reached can be shortened by setting a longer charge stop time after the full charge determination as the battery temperature decreases in addition to setting a larger additional charging count as the battery temperature decreases.

It should be noted that, in the above description, the full charge determination count and the charge stop time set after the first full charge determination are maintained until the end of the control. However, to further increase the efficiency of the charging control, the charge stop time may be corrected every time the full charge determination is made. For example, in additional charging, a charging current is smaller than that before the full charge determination and a density difference of the dispersion substances by polarization is less likely to be generated since the battery voltage is close to the full charging voltage. That is, the battery voltage is less likely to drop while charging is stopped after the full charge determination. Thus, the influence of polarization becomes smaller as the full charge determination count increases and the charge stop time for waiting for the resolution of polarization can be shortened. Accordingly, it is prevented to set a charge stop time longer than necessary by multiplying the charge stop time set according to the battery temperature by a correction coefficient α, which is a value not larger than 1 and becomes smaller as the full charge determination count increases, to shorten the charge stop time as the full charge determination count increases.

Figure 10:
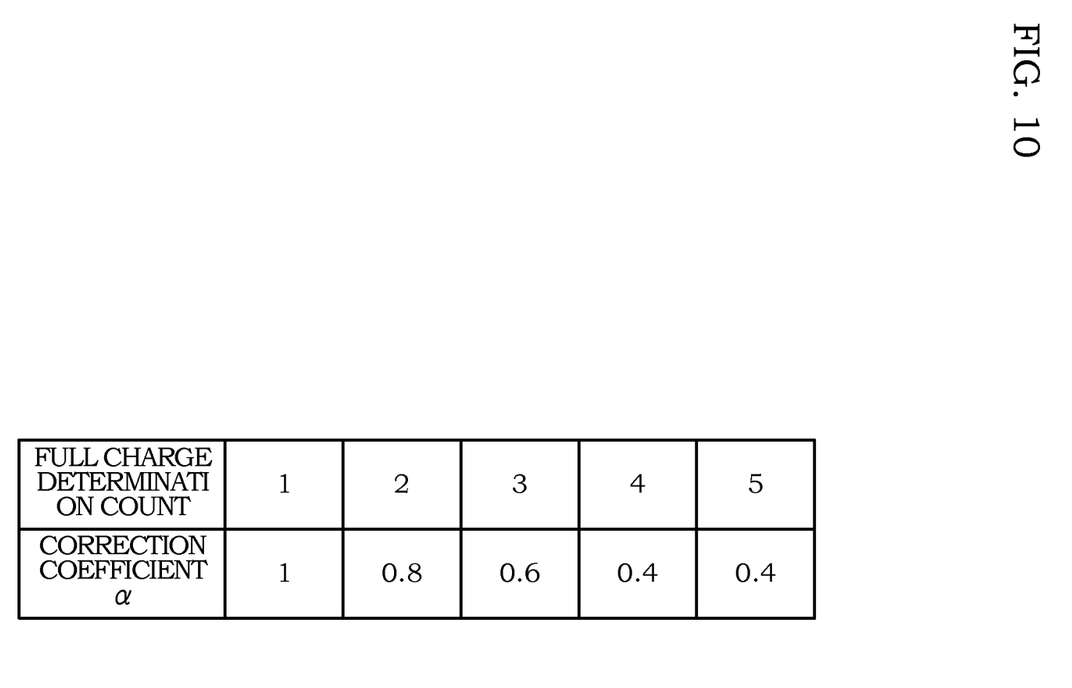
FIG. 10 is a correction coefficient table for charge stop time correction.

For example, the correction coefficient α is set by reading a table set in advance as shown in FIG. 10. It should be noted that, in FIG. 10, the correction coefficient α is constant in the fourth and subsequent full charge determinations although it becomes gradually smaller every time the full charge determination is made in the first to fourth full charge determinations. The correction coefficient α is constant in the fourth and subsequent full charge determinations because the influence of polarization hardly changes.

Further, the battery temperature may be read every time the full charge determination is made and the full charge determination count may be readjusted based on the battery temperature. An appropriate full charge determination count corresponding to an increase of the battery temperature during additional charging can be set.

By the above, the following effects are obtained in the present embodiment in addition to effects similar to those of the first embodiment.

The stop time setting unit 13 is further provided which sets the charge stop time at least based on the battery temperature at the time of the full charge determination, a longer charge stop time is set as the battery temperature decreases. Thus, the resolution of polarization is advanced until the start of additional charging and additional charging can be more efficiently performed.

Since the charge stop time is reductively corrected every time the full charge determination is made, the charge stop time corresponding to a degree of resolution of polarization can be set and additional charging can be more efficiently performed.

In the above reductive correction, the stop time when the full charge determination count reaches a predetermined count is kept thereafter once the full charge determination count reaches the predetermined count. Thus, an appropriate charge stop time can be set also after the aforementioned influence of polarization no longer changes.

Embodiments of this invention were described above, but the above embodiments are merely examples of applications of this invention, and the technical scope of this invention is not limited to the specific constitutions of the above embodiments.

This application claims priority based on Japanese Patent Application No. 2012-181793 filed with the Japan Patent Office on Aug. 20, 2012, the entire contents of which are incorporated into this specification.

The invention claimed is:

1. A charging device for secondary battery, comprising:
a charging power supply capable of outputting power for charging a secondary battery;
a charging power detection unit configured to detect power to be charged to the secondary battery by the charging power supply;
a temperature detection unit configured to detect a temperature of the secondary battery; and
a controller programmed to determine that the secondary battery is fully charged if chargeable power calculated based on a detection value of the charging power detection unit becomes equal to or less than predetermined power set in advance,
the controller being programmed to repeatedly execute a charging control, in which:
power is supplied to the secondary battery from the charging power supply until it is determined that the secondary battery is fully charged,
the supply of power to the secondary battery from the charging power supply is stopped when it is determined that the secondary battery is fully charged,
the supply of power is resumed upon the elapse of a predetermined time after the supply of power is stopped and the supply of power is continued until it is determined that the secondary battery is fully charged again, until the number of times the secondary battery is fully charged reaches a full charge determination count which is a predetermined count indicating the number of times additional charging is performed,
the controller being programmed to set the full charge determination count at least based on the temperature detected by the temperature detection unit when it is determined that the secondary battery is fully charged,
wherein the controller is programmed to set a larger full charge determination count as the temperature detected by the temperature detection unit decreases.

2. The charging device for secondary battery according to claim 1, wherein:
the controller is further programmed to set a time for stopping the supply of power at least based on the temperature detected by the temperature detection unit when it is determined that the secondary battery is fully charged,
wherein the controller is further programmed to set a longer stop time for stopping the supply of power as the temperature detected by the temperature detection unit decreases.

3. The charging device for secondary battery according to claim 2, wherein:
the controller is further programmed to reductively correct the set stop time every time it is determined that the secondary battery is fully charged.

4. The charging device for secondary battery according to claim 3, wherein:
the controller is further programmed to hold the stop time when the full charge determination count reaches the predetermined count thereafter once the full charge determination count reaches the predetermined count.

5. A charging method for secondary battery, comprising:
a charging power detection step of detecting power to be charged to a secondary battery by a charging power supply capable of outputting power for charging the secondary battery;
a full charge determination step of determining that the secondary battery is fully charged if chargeable power calculated based on a detection value of the charging power detection step becomes equal to or less than predetermined power set in advance;
a charging control step of repeatedly executing a charging control, in which:
power is supplied to the secondary battery from the charging power supply until it is determined that the secondary battery is fully charged,
the supply of power to the secondary battery from the charging power supply is stopped when it is determined that the secondary battery is fully charged,
the supply of power is resumed upon the elapse of a predetermined time after the supply of power is stopped and the supply of power is continued until it is determined that the secondary battery is fully charged again, until the number of times the secondary battery is fully charged reaches a full charge determination count which is a predetermined count indicating the number of times additional charging is performed;
a temperature detection step of detecting a temperature of the secondary battery; and
a full charge determination count setting step of setting a larger predetermined count as the temperature detected by the temperature detection step decreases at least based on the temperature detected by the temperature detection step when it is determined that the secondary battery is fully charged.

6. A charging device for secondary battery, comprising:
a charging power supply capable of outputting power for charging a secondary battery;
charging power detection means for detecting power to be charged to the secondary battery by the charging power supply;
full charge determination means for determining that the secondary battery is fully charged if chargeable power calculated based on a detection value of the charging power detection means becomes equal to or less than predetermined power set in advance;

charging control means for repeatedly executing a charging control, in which:
- power is supplied to the secondary battery from the charging power supply until it is determined that the secondary battery is fully charged,
- the supply of power to the secondary battery from the charging power supply is stopped when it is determined that the secondary battery is fully charged,
- the supply of power is resumed upon the elapse of a predetermined time after the supply of power is stopped and the supply of power is continued until it is determined that the secondary battery is fully charged again, until the number of times the secondary battery is fully charged reaches a full charge determination count which is a predetermined count indicating the number of times additional charging is performed;

temperature detection means for detecting a temperature of the secondary battery; and full charge determination count setting means for setting the full charge determination count at least based on the temperature detected by the temperature detection means when it is determined that the secondary battery is fully charged, wherein the full charge determination count setting means sets a larger full charge determination count as the temperature detected by the temperature detection means decreases.

* * * * *